United States Patent
Polleros

(10) Patent No.: US 9,385,679 B1
(45) Date of Patent: Jul. 5, 2016

(54) STAGGERED Y TOPOLOGY FOR MULTIBAND LIMITER

(71) Applicant: Maxim Integrated Products, Inc., San Jose, CA (US)

(72) Inventor: Robert Polleros, Sunnyvale, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 215 days.

(21) Appl. No.: 13/998,467

(22) Filed: Oct. 31, 2013

Related U.S. Application Data

(60) Provisional application No. 61/721,021, filed on Oct. 31, 2012, provisional application No. 61/721,010, filed on Oct. 31, 2012, provisional application No. 61/721,015, filed on Oct. 31, 2012.

(51) Int. Cl.
*H03G 11/00* (2006.01)

(52) U.S. Cl.
CPC ..................................... *H03G 11/00* (2013.01)

(58) Field of Classification Search
None
See application file for complete search history.

(56) References Cited

U.S. PATENT DOCUMENTS

| | | | | |
|---|---|---|---|---|
| 4,843,626 A | * | 6/1989 | Werrbach | 381/107 |
| 5,515,446 A | * | 5/1996 | Velmer | 381/98 |
| 5,737,432 A | * | 4/1998 | Werrbach | 381/94.1 |
| 8,351,621 B2 | * | 1/2013 | Lehnert et al. | 381/106 |
| 2012/0250893 A1 | * | 10/2012 | Carroll et al. | 381/107 |

OTHER PUBLICATIONS

Bortoni, Constânclo et al., "Real-Time Voice-Coil Temperature and Cone Displacement Control of Loudspeakers", AES 117th Convention, San Francisco, CA., Oct. 2004, pp. 2-8.

* cited by examiner

*Primary Examiner* — Sonia Gay
(74) *Attorney, Agent, or Firm* — TIPS Group

(57) ABSTRACT

A multiband limiter with Staggered-Y topology including a band splitter having a signal input and a plurality of bands, a first band limiter having an input coupled to a first band of the band splitter, a first summer having a first input coupled to an output of the first band limiter and a second input coupled to a second band of the band splitter, and a first summer limiter having an input coupled to an output of the first summer.

8 Claims, 3 Drawing Sheets

STAGGERED Y TOPOLOGY FOR MULTIBAND LIMITER

CROSS REFERENCE TO RELATED APPLICATION(S)

This application claims the benefits of provisional patent applications U.S. Ser. No. 61/721,021, 61/721,010 and 61/721,015, all filed Oct. 31, 2012, and all of which are incorporated herein by reference.

BACKGROUND

Audio player devices, particularly those with headphones, attempt to optimize loudness within given maximum headroom constraints. Examples of such devices include smartphones, tablet computers and standalone GPS devices. For this purpose, a special form of compressor known as a "limiter" can be used.

As is well known to those of skill in the art, "headroom" is the amount by which the signal-handling capabilities of an audio system exceed a designated level known as Permitted Maxim Level (PML). Headroom can be thought of as a "safety zone" allowing transient audio peaks to exceed the PML without exceeding the signal capabilities of an audio system (e.g. by generating clipping and/or other artifacts).

FIG. 1 is a graph illustrating operating characteristics of prior art compressors where signal levels in decibels (dB) are shown along a horizontal axis and output levels in dB are shown along a vertical axis. When the input level is below a threshold level, the output level is the same as the input level. This is referred to as a 1:1 compression ratio for the compressor. Also illustrated are other compression ratios including 2:1, 4:1, and 00:1 above the threshold level. With all compression ratios greater than 1:1, the output signal level will be less than the input signal level when the input signal level exceeds the threshold. A limiter is a special case of a compressor, having a compression rate of almost infinity above the threshold, i.e. having a compression ratio approaching 00:1.

The historical use of limiters was to fit unknown input signals into a known audio headroom for analog or digital recording devices, radio transmitters, etc. In more recent years, "make-up gain" limiters or "maximizers" have been used to increase loudness while maintaining peak signals within a given headroom. The additional gain can be either applied before the limiter (which needs increased headroom to cover the larger signals), or the threshold can be set to a fraction of the headroom, followed by a gain stage of 1/fraction. The higher the make-up gain and the shorter the release time of the circuit the more loudness increases, but only at the expense of the generation of artifacts due to rapid gain changes.

FIG. 2 is a high-level block diagram of a prior art feedforward, single-band limiter. In the event that the input signal exceeds the threshold, the system calculates the gain reduction needed for the output to stay at or below the threshold level. That is, the input signal is split between a forward path containing a gain element (attenuator), and a side chain, that measures the level of the signal, compares it against a threshold level, and calculates the attenuation needed for the output to stay at or below the threshold level. Limiters usually detect the rectified peak level of the signal, and use short attack times. A theoretically ideal attack time of zero avoids the output exceeding the threshold for even transient input signals.

Single-band limiters work adequately well within a relatively a narrow frequency range for the input signal. For example, single-band limiters can be adequate for an input signal derived from the playing of a single musical instrument. However, when there are multiple instruments being played (e.g. a drum, a violin, etc.) distortion can be generated, sometimes referred to as an audible effect or "artifact" of the system. To address this problem, multiband limiters have been developed which provide separate limiters for different frequency bands, e.g. for frequency bands which might primarily apply to different musical instruments.

With a multiband limiter the frequency band is split into two or more bands such that adding the bands back together recovers the original signal. This can be accomplished with "constant voltage" filters like Linkwitz-Riley or phase linear FIR filters, as will be appreciated by those of skill in the art. With such multiband limiters, each band is individually limited and the outputs from all of the band limiters are summed together to obtain the output signal. Since the sum of the individual band limiters can exceed the threshold another limiter is needed after the summing point of the individual band limiters.

In FIG. 3, a prior art multiband limiter includes a low pass filter $F_L$, a bandpass filter $F_B$ and a high pass filter $F_H$. Each of the filters is provided with its own limiter, namely limiter $L_L$, limiter $L_M$, and limiter $L_H$, respectively. The outputs of the three limiters are summed together in a summer S before the output is applied to a final limiter $L_{LMH}$, which provides the signal output.

The purpose of multiband limiters, such as the multiband limiter of FIG. 3, is to increase loudness while avoiding audible artifacts. However there are cases where artifacts produced by multiband limiters may exceed those produced by single-band limiters. For example, when a tone or musical instrument is reproduced at a crossover frequency (e.g. at a frequency at the interface between two adjacent bands) the audio signal may be simultaneously present in both bands, with the result that the make-up gain increases its level in both bands. For example, a signal at the transition between the low pass filter band and the bandpass filter band might be amplified within both bands, doubling its level. In a subsequent wideband limiter this twice-as-loud signal significantly attenuates the level of the remaining signal.

It will therefore be appreciated that, with a multiband limiter of the prior art, a problem occurs when an input tone is at a cross-over frequency which can produce, at the summing point, two full-scale, in-phase signals that can attenuate the outputs of other stage(s) to be attenuated, resulting in an artifact. According to typical audio frequency distributions, this effect is much more likely to happen at the lower crossover frequencies, e.g. between the low pass band and the bandpass band in the example of FIG. 3.

FIG. 4 further illustrates this problem. A first graph A shows a Band1 corresponding to the band of the low pass filter of FIG. 3, a Band2 corresponding to the bandpass filter of FIG. 3, and a Band3 corresponding to the high pass filter of FIG. 3. As described above, artifacts can occur when a signal falls between two bands, such as between Band1 and Band2. This situation can be seen in graph B. As also described above, an input signal ("tone") at the interface between Band1 and Band2 (e.g. between the low pass filter band and the bandpass filter band) tends to create more artifacts than a signal falling between Band2 and Band3 because lower frequency tones are generally louder than higher frequency tones. Graph B also shows a high frequency signal falling only in Band 3.

As seen in graphs C and D of FIG. 4, when a signal falls between Band1 and Band2, it shows up in both the Band1 and the Band2 outputs, effectively doubling the level of that signal. Since the outputs of Band1, Band2 and Band3 (as seen in graph E) are summed (see graph F) and then limited, the output signal of graph G has Tone1 (corresponding to the lower frequency input signal) of significantly higher level than that of Tone2 (corresponding to the higher frequency input signal). The audio signal has therefore been distorted and an audio effect or artifact has been developed.

Another problem prior art multiband limiters is that the various frequency bands are limited equally which does not provide optimal sound pressure level (SPL) or "loudness" in audio applications. Also, prior art multiband limiters require n+1 limiters, where n is the number of frequency bands.

These and other limitations of the prior art will become apparent to those of skill in the art upon a reading of the following descriptions and a study of the several figures of the drawing.

SUMMARY

In an embodiment, set forth by way of example and not limitation, a multiband limiter with Staggered-Y topology includes a band splitter, a first band limiter, a first summer and a first summer limiter. The band splitter splits a signal input into a plurality of bands. The first band limiter has an input coupled to a first band of the band splitter and the first summer has a first input coupled to an output of the first band limiter and a second input coupled to a second band of the band splitter. The a first summer limiter has an input coupled to an output of the first summer.

In an embodiment, set forth by way of example and not limitation, a method for providing multiband signal limitation includes: (a) splitting an input signal into a plurality of bands; (b) limiting a first band to develop a limited first band; (c) limiting a second band to develop a limited second band; (d) summing the limited first band with the limited second band to provide a first summer output; and (e) limiting the first summer output to develop a limited first summer output.

In an embodiment, set forth by way of example and not limitation, a method for providing multiband signal limitation includes: (a) splitting an input signal into a plurality of bands; (b) limiting a first band to develop a limited first band; (c) summing the limited first band with a second band to provide a first summer output; and (d) limiting the first summer output to develop a limited first summer output.

An advantage of certain example embodiments is that selected frequency bands can be emphasized to enhance the output characteristics of the multiband limiter.

Another advantage of certain example embodiments is that crossover regions between adjacent bands are better handled with respect to prior multiband limiters.

Further advantages of example certain embodiments include the reduction of audible artifacts, an increase in the level of the high frequency band, and/or significant increase of overall loudness.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENT(S)

Figure 1:
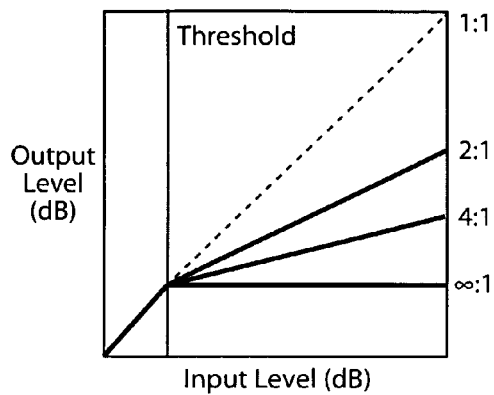
FIG. 1 is a graph illustrating typical operating characteristics of prior art compressors.
Figure 2:
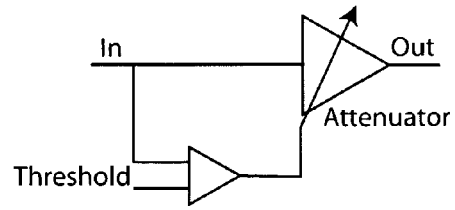
FIG. 2 is a high level block diagram of a typical prior art compressor.
Figure 3:
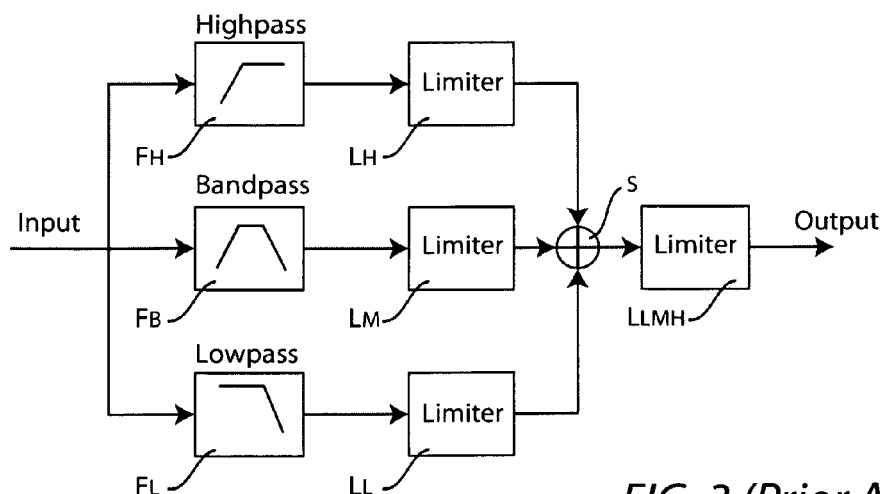
FIG. 3 is a block diagram of an example prior art multiband limiter.
Figure 4:
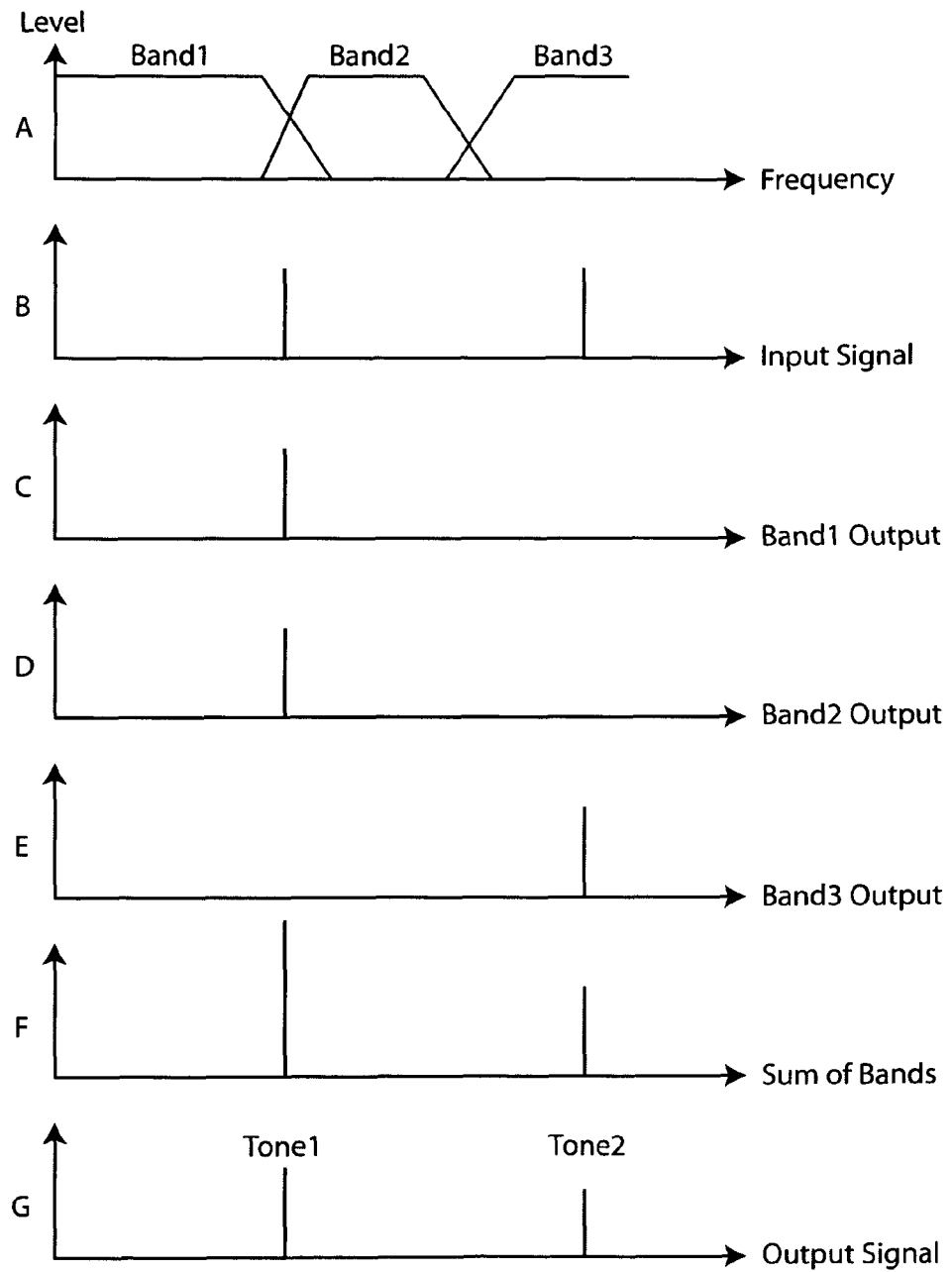
FIG. 4 illustrates how artifacts can be generated by the operation of the prior art multiband limiter of FIG. 3.
Figure 5:
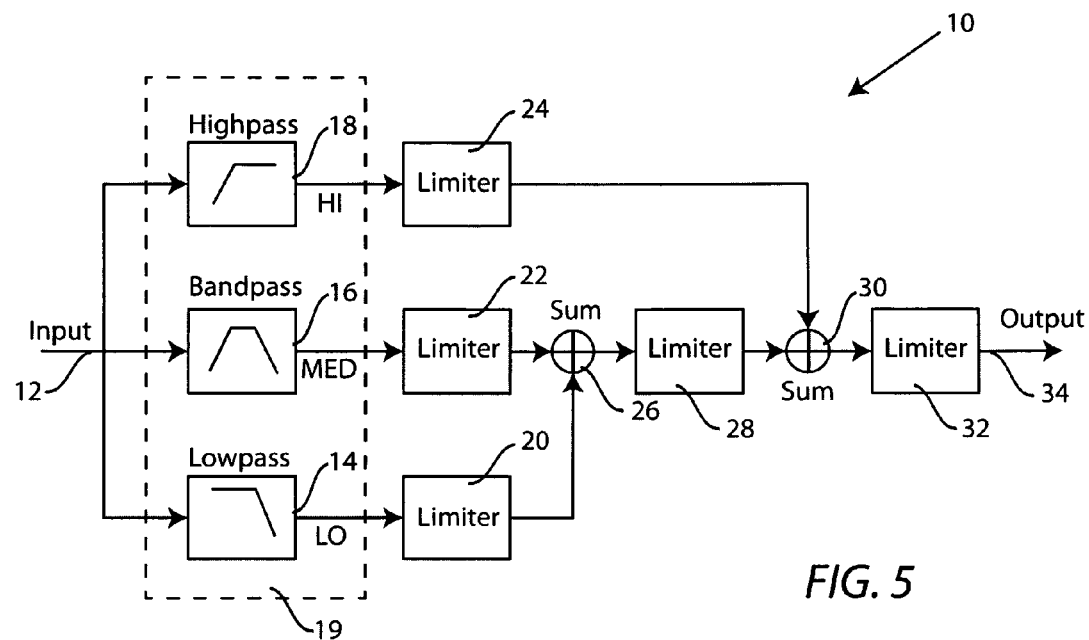
FIG. 5 is a block diagram, set forth by way of example and not limitation, of a first example embodiment of a multiband limiter with a Staggered-Y topology.
Figure 6:
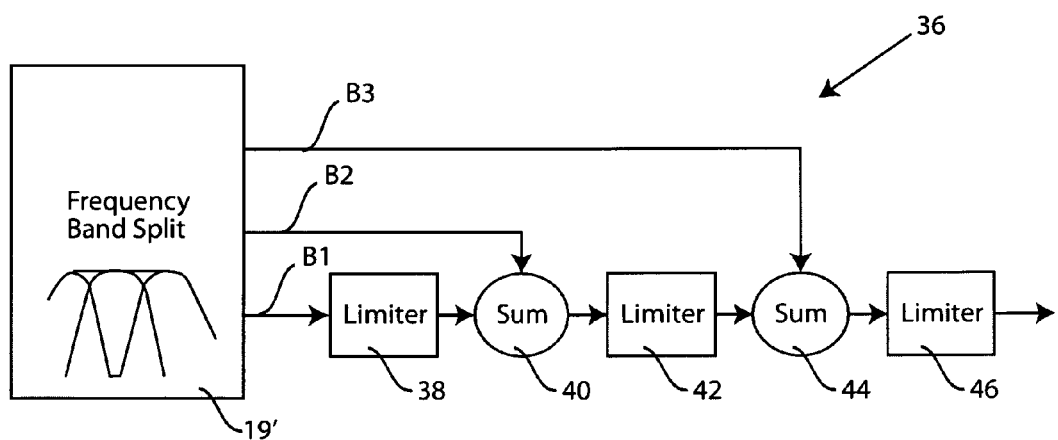
FIG. 6 is a block diagram, set forth by way of example and not limitation, of a second example embodiment of a multiband limiter with a Staggered-Y topology.

FIGS. 1-4 were discussed with reference to the prior art. FIGS. 5 and 6 are block diagrams of two example "Staggered-Y" topologies for multiband limiters. As well known to those of skill in the art, a "Y" topology is one of the two simplest possible three-terminal linear networks (the other being a "Δ" topology). Example embodiments disclosed herein stagger the summation of frequency bands to improve the performance of a multiband limiter.

In the non-limiting example of FIG. 5, a multiband limiter 10 includes an input 12, a low pass filter 14, a bandpass filter 16, a high pass filter 18, a first band limiter 20, a second band limiter 22, a third band limiter 24, a first summer 26, a first summer limiter 28, a second summer 30 and a second summer limiter 32 having an output 34. Input 12 is coupled to an input of low pass filter 14, an output of low pass filter 14 is coupled to an input of limiter 20, and an output of limiter 20 is coupled to an input of summer 26. Input 12 is also coupled to an input of bandpass filter 16, an output of bandpass filter 16 is coupled to an input of limiter 22, and an output of limiter 22 is coupled to summer 26. An output of summer 26 is coupled to an input of limiter 28, and an output of limiter 28 is coupled to an input of limiter 32. Input 12 is also coupled to an input of high pass filter 18, an output of high pass filter 18 is coupled to an input of limiter 24, and an output of limiter 24 is coupled to an input of summer 30. The effect of having the high frequency band added in later in summer 30 by being in a "car pool lane" bypassing the summer 26 and limiter 28 to boost its relative loudness compared to signals in the lower frequency bands so that it isn't, for example, 'drowned out' by loud bass input tones. However, the amount of emphasis of the high frequency band is still limited by the limiter.

In the first example of FIG. 5, the filters 14, 16 and 18 comprise a band splitter 19. As will be appreciated by those of skill in the art, band splitter 19 can be implemented in a number of technologies including discrete components, hardware logic and programmed logic such as that implemented by a digital signal processor (DSP). The band splitter 19 takes the signal input 12 and creates a plurality of frequency bands, e.g. a low frequency band LO, a medium frequency band MED and a high frequency band HI. While in this example there are three bands, it will be appreciated that the number of bands n can be two or more, i.e. the plurality of bands is n≥2. It will be further appreciated that the number of summers for this example embodiment is n−1 and the number of limiters is 2n−1.

In the non-limiting example of FIG. 5, the term "Staggered-Y topology" refers to the summing and limiting of two adjacent limited bands prior to summing with one or more additional limited bands. This can also be referred to as "cascading" the limiters. In this non-limiting example with three bands, the low pass band and the band pass band are first individually limited, summed and the sum is limited prior to being summed with the limited high pass filter band. In this way, if a signal falls in the bandwidth of both the low pass filter 14 and the bandpass filter 16, creating a doubled output at the summer 26, the limiter 28 limits the input to summer 30 to where it should be so that it does not overwhelm the input from high pass filter limiter 24. This has the effect of reducing artifacts caused by signals falling between the two lower bands and also gives the high frequency band priority (making the high frequencies relatively louder).

With continuing reference to FIG. 5, an example method, set forth by way of example and not limitation, for providing multiband signal limitation includes: (a) splitting an input signal into a plurality of bands; (b) limiting a first band to develop a limited first band; (c) limiting a second band to develop a limited second band; (d) summing the limited first band with the limited second band to provide a first summer output; and (e) limiting the first summer output to develop a limited first summer output. By way of further example, the method may further include: (f) limiting a third band to develop a limited third band; (g) summing the limited third band with the first summer output to develop a second summer output; and (h) limiting the second summer output to develop a limited second summer output. With this example method, it will be appreciated that when the plurality of bands is n≥2 and the number of summing operations is n−1 and the number of limiting operations is 2n−1.

In FIG. 6, another example, set forth by way of example and not limitation, of a multiband limiter 36 includes a band splitter 19' operative to split a signal input into a plurality of bands B1, B2 and B3. In this example, a first band limiter 38 has an input coupled to a first band B1 of the band splitter 19', a first summer 40 has a first input coupled to an output of the first band limiter 38 and a second input coupled directly to a second band B2 of the band splitter, and a first summer limiter 42 has an input coupled to an output of the first summer 40. The example multiband limiter 36 also includes a second summer 44 having a first input coupled to an output of the first summer limiter 42 and a second input coupled directly to a third band B3 of the band splitter 19', and a second summer limiter 46 has an input coupled to an output of the second summer 44.

It will be appreciated that the second example embodiment of FIG. 6 can have a plurality of bands n≥2 and wherein the number of summers associated with the n bands is n−1. However, unlike the first example embodiment of FIG. 5, this second example embodiment only requires n limiters instead of 2n−1 limiters. The number of additional limiters required by the first example embodiment is therefore n−1, or one extra limiter for two bands, two extra limiters for three bands, three extra limiters for four bands, etc. Therefore, the second example embodiment of FIG. 6 has the advantage of requiring fewer limiters with the resultant reduction of design complexity and cost savings.

In the non-limiting example of FIG. 6, the term "Staggered-Y topology" refers to the summing and limiting of two adjacent bands (only one of which is limited) prior to summing with one or more additional unlimited bands. Again can also be referred to as "cascading" the limiters. In this non-limiting example with three bands, band B1 is limited and then summed with band B2, which not limited. The sum of the two is then limited prior to being summed with the unlimited band B3. This arrangement also effectively results in the reduction of artifacts caused by signals falling between the bands. Furthermore, the example embodiment of FIG. 6 also has the advantage of emphasizing the last band B3 that is summed. In this example, the band B3 is not limited before it is summed with the output of limiter 42 in summer 44. The band B3 will therefore be emphasized over bands B1 and B2 and, in fact, will be allocated 50% of the headroom.

With continuing reference to FIG. 6, an example method, set forth by way of example and not limitation, for providing multiband signal limitation includes: (a) splitting an input signal into a plurality of bands; (b) limiting a first band to develop a limited first band; (c) summing the limited first band with a second band to provide a first summer output; and (d) limiting the first summer output to develop a limited first summer output. In a further example embodiment, the method further includes: (e) summing the first summer output with a third band to develop a second summer output; and (f) limiting the second summer output to develop a limited second summer output. It will be appreciated that, in this example method, where the plurality of bands is n≥2 the number of summers is n−1 and the number of limiters is 2n−1.

While the example embodiments of FIGS. 5 and 6 have their differences, it should be appreciated that both of these embodiments have a Staggered-Y topology including a band splitter, a first band limiter, a first summer and a first summer limiter. When the number of bands is n=2, the two embodiments differ only in that one of the band inputs to the summer is not first put through a limiter (e.g. the second embodiment of FIG. 6). The two example embodiment continue to diverge with when the number of bands increases, where each additional band requires two extra limiters in the first embodiment of FIG. 5 but only one extra limiter in the second embodiment of FIG. 6.

In the first example embodiment of FIG. 5, the plurality of bands were arranged in an ascending frequency order, e.g. a low frequency range band LO, a medium frequency range band MED and a high frequency range band HI. This ordering gives band LO and band MED equal emphasis and band HI more emphasis that the other bands. It will be appreciated that the order of the bands can be reversed so that they are in a descending order, e.g. band HI, band MED, band LO. This would provide band LO with the greatest emphasis. In other example embodiments, other orderings of the bands can be provided in order to emphasize the relative prominence of the bands.

In the second example of FIG. 6, the bands B1, B2 and B3 are in reverse order of emphasis. That is, band B3 will be emphasized with respect to bands B1 and B2, and band B2 will be emphasized with respect to band B1. It will therefore be appreciated that the bands can be in ascending order, descending order, or any other order desired to emphasize the relative prominence of the bands. For example, if the three bands are F1, F2 and F3, the bands B1/B2/B3 can be ordered, for example, as F1/F2/F3, F1/F3/F2, F2/F1/F3, F2/F3/F1, F3/F1/F2, and F3/F2/F1. The relative prominence of the bands will be B3/B2/B1. As will be appreciated by those of skill in the art, "prominence" can also be thought of as "prioritizing", "emphasizing", "boosting", "favoring", etc. of frequency bands with respect to each other.

As will be appreciated by those of skill in the art, the methods and apparatus disclosed herein are not limited to the example embodiments set forth above. Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A multiband limiter with Staggered-Y topology comprising:
    a band splitter having a signal input and a plurality of bands, wherein the plurality of bands is n≥2;
    a first band limiter having an input coupled to a first band of the band splitter;
    a first summer having a first input coupled to an output of the first band limiter and a second input coupled to a second band of the band splitter, wherein the second input of the first summer is coupled to the second band of the band splitter by a second band limiter and wherein the number of summers is n−1;
    a first summer limiter having an input coupled to an output of the first summer;
    a second summer having a first input coupled to an output of the first summer limiter and a second input coupled to a third band of the band splitter by a third band limiter; and
    a second summer limiter having an input coupled to an output of the second summer.

2. A multiband limiter with Staggered-Y topology comprising:
    a band splitter having a signal input and a plurality of bands, wherein the plurality of bands is n≥2;
    a first band limiter having an input coupled to a first band of the band splitter;
    a first summer having a first input coupled to an output of the first band limiter and a second input coupled to a second band of the band splitter, wherein the second input of the first summer is directly coupled to the second band of the band splitter, and wherein the number of summers is n−1;
    a first summer limiter having an input coupled to an output of the first summer;
    a second summer having a first input coupled to an output of the first summer limiter and a second input directly coupled to a third band of the band splitter; and
    a second summer limiter having an input coupled to an output of the second summer.

3. A multiband limiter with Staggered-Y topology as recited in claim 2 wherein the plurality of bands is in an ascending frequency order.

4. A multiband limiter with Staggered-Y topology as recited in claim 2 wherein the plurality of bands is in a descending frequency order.

5. A multiband limiter with Staggered-Y topology as recited in claim 2 wherein the first band is an intermediate frequency band.

6. A multiband limiter with Staggered-Y topology as recited in claim 2 wherein the order of the bands is chosen to emphasize the relative prominence of the bands.

7. A method for providing multiband signal limitation comprising:
    splitting an input signal into a plurality of bands;
    limiting a first band to develop a limited first band, wherein the limiting is accomplished by a band limiter
    limiting a second band to develop a limited second band;
    summing the limited first band with the limited second band to provide a first summer output;
    limiting the first summer output to develop a limited first summer output;
    limiting a third band to develop a limited third band;
    summing the limited third band with the first summer output to develop a second summer output; and
    limiting the second summer output to develop a limited second summer output;
    wherein the plurality of bands is n≥2 and the number of summers is n−1.

8. A method for providing multiband signal limitation comprising:
    splitting an input signal into a plurality of bands;
    limiting a first band to develop a limited first band, wherein the limiting is accomplished by a band limiter
    summing the limited first band with a second band to provide a first summer output; and
    limiting the first summer output to develop a limited first summer output;
    summing the first summer output with a third band to develop a second summer output; and
    limiting the second summer output to develop a limited second summer output;
    wherein the plurality of bands is n≥2 and wherein the number of summers is n−1.

* * * * *